United States Patent
Ueno et al.

(10) Patent No.: US 8,946,056 B2
(45) Date of Patent: Feb. 3, 2015

(54) SPLITTING METHOD FOR OPTICAL DEVICE WAFER

(75) Inventors: Hiroumi Ueno, Ota-Ku (JP); Hitoshi Hoshino, Ota-Ku (JP)

(73) Assignee: Disco Corporation, Tokyo (JP)

( * ) Notice: Subject to any disclaimer, the term of this patent is extended or adjusted under 35 U.S.C. 154(b) by 450 days.

(21) Appl. No.: 13/465,186

(22) Filed: May 7, 2012

(65) Prior Publication Data

US 2012/0289026 A1    Nov. 15, 2012

(30) Foreign Application Priority Data

May 12, 2011    (JP) ................................ 2011-107206

(51) Int. Cl.
| | |
|---|---|
| H01L 21/78 | (2006.01) |
| B23K 26/38 | (2014.01) |
| B23K 26/08 | (2014.01) |
| B23K 26/40 | (2014.01) |
| H01L 33/00 | (2010.01) |

(52) U.S. Cl.
CPC .............. *B23K 26/38* (2013.01); *B23K 26/0853* (2013.01); *B23K 26/4075* (2013.01); *H01L 33/0095* (2013.01)
USPC ................ 438/463; 438/33; 438/68; 438/460

(58) Field of Classification Search
CPC ....... H01L 21/78; H01L 21/784; H01L 21/82; H01L 21/782
USPC ...................................... 438/33, 68, 460, 463
See application file for complete search history.

(56) References Cited

U.S. PATENT DOCUMENTS

2006/0148212 A1*   7/2006   Fukuyo et al. ............... 438/463

FOREIGN PATENT DOCUMENTS

| JP | 10-125956 | 5/1998 |
|---|---|---|
| JP | 10-308532 | 11/1998 |
| JP | 2005-086161 | 3/2005 |

* cited by examiner

*Primary Examiner* — Ha Tran T Nguyen
*Assistant Examiner* — Suberr Chi
(74) *Attorney, Agent, or Firm* — Greer Burns & Crain Ltd.

(57) ABSTRACT

In a splitting method for an optical device wafer, the wafer having optical devices formed individually in regions partitioned by a plurality of crossing scheduled splitting lines provided on a front surface and having a reflective film formed on a reverse surface, a focal point of a laser beam is positioned to the inside of the optical device wafer and the laser beam is irradiated along the scheduled splitting lines from the reverse surface side of the wafer to form modification layers in the inside of the wafer. An external force is applied to the wafer to split the wafer along the scheduled splitting lines and form a plurality of optical device chips. The laser beam has a wavelength that produces transmittance through the reflective film equal to or higher than 80%.

3 Claims, 9 Drawing Sheets

SPLITTING METHOD FOR OPTICAL DEVICE WAFER

BACKGROUND OF THE INVENTION

1. Field of the Invention

This invention relates to a splitting method for an optical device wafer in which a light emitting layer having a plurality of optical devices is formed by epitaxial growth on a substrate for crystal growth of sapphire or the like.

2. Description of the Related Art

By a fabrication process of an optical device such as a laser diode (LD) or a light emitting diode (LED), an optical device wafer is fabricated in which a light emitting layer (epitaxial layer) having a plurality of optical devices is formed by, for example, epitaxial growth on an upper face of a substrate for crystal growth formed from sapphire, SiC or the like. An optical device such as an LD or an LED is formed in each of regions partitioned by scheduled splitting lines formed like a lattice, and individual optical devices are fabricated by splitting the optical device wafer along the scheduled splitting lines into pieces.

Conventionally, as a method of splitting an optical device wafer along scheduled splitting lines, a method is known in which a pulse laser beam of a wavelength having absorbability by the wafer is irradiated along the scheduled splitting lines to form laser worked grooves and then external force is applied to the laser worked grooves to cut the optical device wafer (refer to, for example, Japanese Patent Laid-Open No. Hei 10-305420). Also another method has been proposed in which the focal point of a pulse laser beam of a wavelength having transmittance through the optical device wafer is adjusted to the inside of the wafer, the pulse laser beam is irradiated to form modification layers along the scheduled splitting lines in the inside of the wafer, and then external force is applied to the scheduled splitting lines along which the strength is reduced by the modification layers to split the optical device wafer (refer to, for example, Japanese Patent Laid-Open No. 2005-86161).

Meanwhile, an optical device chip having a reflective film formed on the reverse surface side thereof in order to enhance the luminance of an optical device is proposed in Japanese Patent Laid-Open No. 10-125956 and Japanese Patent Laid-Open No. Hei 10-308532.

SUMMARY OF THE INVENTION

Where a laser beam is irradiated from the front surface side of an optical device wafer in a state in which the focal point of the laser beam is adjusted to the inside of the optical device waver, there is such a problem as described below. In particular, as the focal point of the laser beam positioned in the inside of the optical device wafer approaches the reverse surface side of the optical device wafer, the beam spot of the laser beam on the front surface of the optical device wafer increases in size. Accordingly, in order to prevent the optical device from being damaged by irradiation of the laser beam, a sufficient width of scheduled splitting lines is required. This decreases the number of optical device chips obtained for each optical device wafer and deteriorates the productivity.

Among various optical device wafers, some optical device wafers have fine irregularities formed on the interface side of a substrate for crystal growth with an epitaxial layer thereof in order to improve the luminance of optical device chips. With such an optical device wafer as just described, a laser beam cannot be irradiated from the front surface side. On the other hand, where a laser beam is irradiated from the reverse surface side of an optical device wafer, if the optical device wafer has a reflective film formed on the reverse surface side thereof, then depending upon the type of the reflective film or the wavelength of the laser beam, the laser beam irradiated upon the reverse surface of the optical device wafer is reflected. Therefore, there is a problem that laser processing cannot be carried out.

Therefore, it is an object of the present invention to provide a splitting method for an optical device wafer in which a laser beam can be irradiated from the reverse surface side of an optical device wafer having a reflective film on the reverse surface side thereof to split the optical device wafer into individual optical device chips.

In accordance with an aspect of the present invention, there is provided a splitting method for an optical device wafer, in which optical devices are formed individually in regions partitioned by a plurality of crossing scheduled splitting lines provided on a front surface and a reflective film is formed on a reverse surface, including: a laser beam irradiation step of positioning a focal point of a laser beam to the inside of the optical device wafer and irradiating the laser beam along the scheduled splitting lines from the reverse surface side of the optical device wafer to form modification layers in the inside of the optical device wafer; and a splitting step of applying, after the laser beam irradiation step is carried out, external force to the optical device wafer and splitting the optical device wafer along the scheduled splitting lines to form a plurality of optical device chips. A wavelength of the laser beam irradiated upon the optical device wafer in the laser beam irradiation step has the transmittance through the reflective film of equal to or higher than 80%.

Preferably, the wavelength of the laser beam irradiated upon the optical device wafer in the laser beam irradiation step ranges from 680 nm to 1 mm. Preferably, the reflective film is configured from a multilayer film formed from stacked materials having different refractive indices.

The inventor of the present invention found out through extensive studies that a modification layer can be formed in the inside of an optical device wafer by irradiating, from a reverse surface side of the optical device wafer, a laser beam of a wavelength with which the reflectance of a reflective film with regard to the laser beam is lower than 20%, that is, the transmittance of the laser beam through the reflective film is equal to or higher than 80%.

Based on this finding, according to the present invention, it is possible to irradiate a laser beam from a reverse surface side of an optical device wafer having a reflective film on the reverse surface thereof to form a modification layer in the inside of the optical device wafer and split the optical device wafer into optical device chips using the modification layer as a splitting starting point. Consequently, such conventional problems that laser processing cannot be carried out from the reverse surface side or the productivity is deteriorated can be solved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
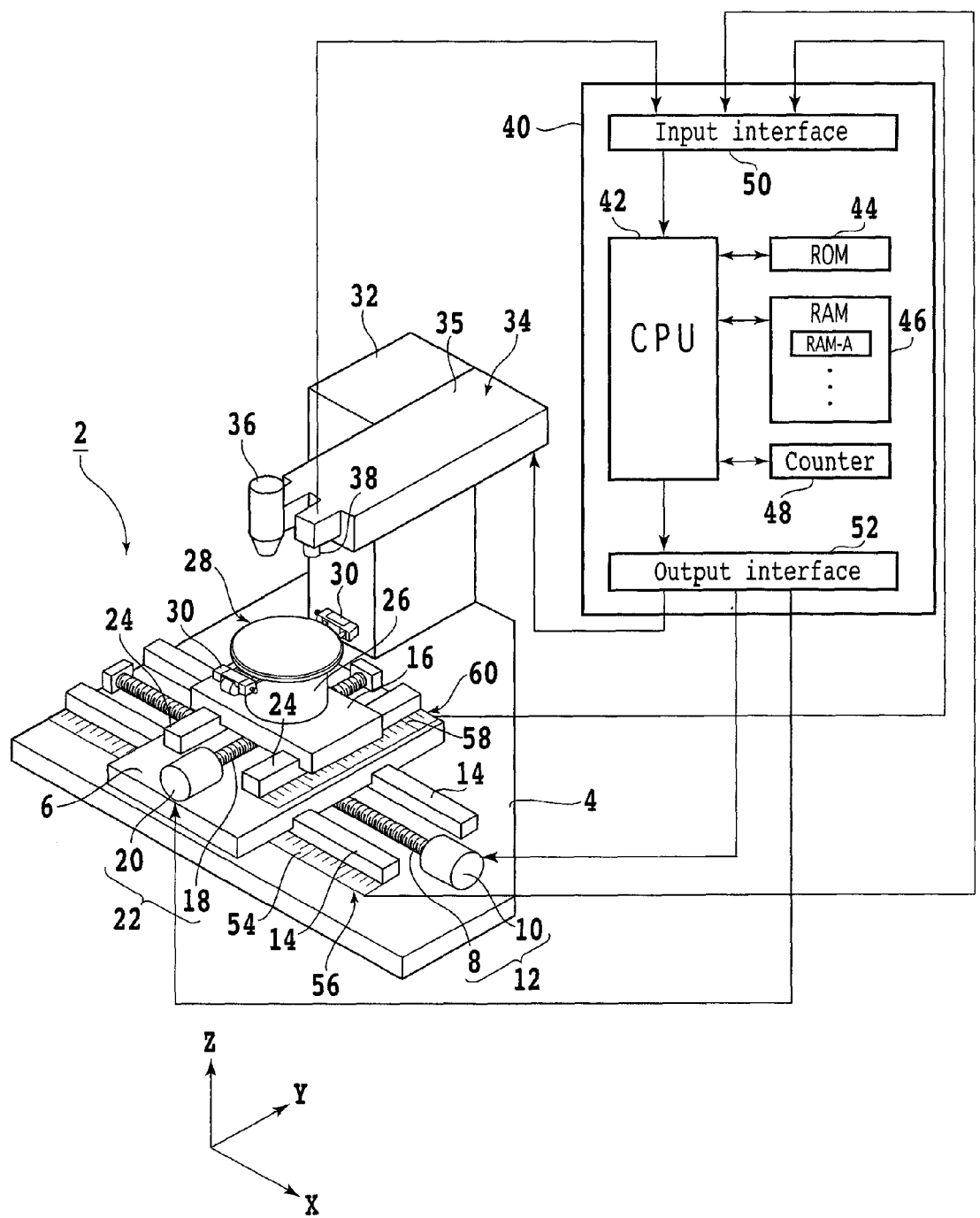
FIG. 1 is a perspective view of a laser processing apparatus suitable for carrying out a splitting method according to the present invention.

In the following, embodiments of the present invention are described in detail with reference to the drawings. Referring to FIG. 1, there is shown a general configuration of a laser processing apparatus 2 suitable to form a modification layer serving as a splitting starting point in a splitting method for an optical device wafer according to the present invention. The laser processing apparatus 2 includes a first slide block 6 mounted movably in an X-axis direction on a stationary base 4. The first slide block 6 is moved in a work feeding direction, that is, in the X-axis direction, along a pair of guide rails 14 by a work feeding means 12 configured from a ball screw 8 and a stepping motor 10.

A second slide block 16 is mounted movably in a Y-axis direction on the first slide block 6. In particular, the second slide block 16 is moved in an indexing direction, that is, in the Y-axis direction, along a pair of guide rails 24 by an indexing feeding means 22 configured from a ball screw 18 and a stepping motor 20. A chuck table 28 is mounted on the second slide block 16 with a cylindrical supporting member 26 interposed therebetween, and the chuck table 28 is movable in the X-axis direction and the Y-axis direction by the work feeding means 12 and the indexing feeding means 22. The chuck table 28 has a clamp 30 provided thereon for clamping an annular frame for supporting a wafer sucked to and held on the chuck table 28.

Figure 2:
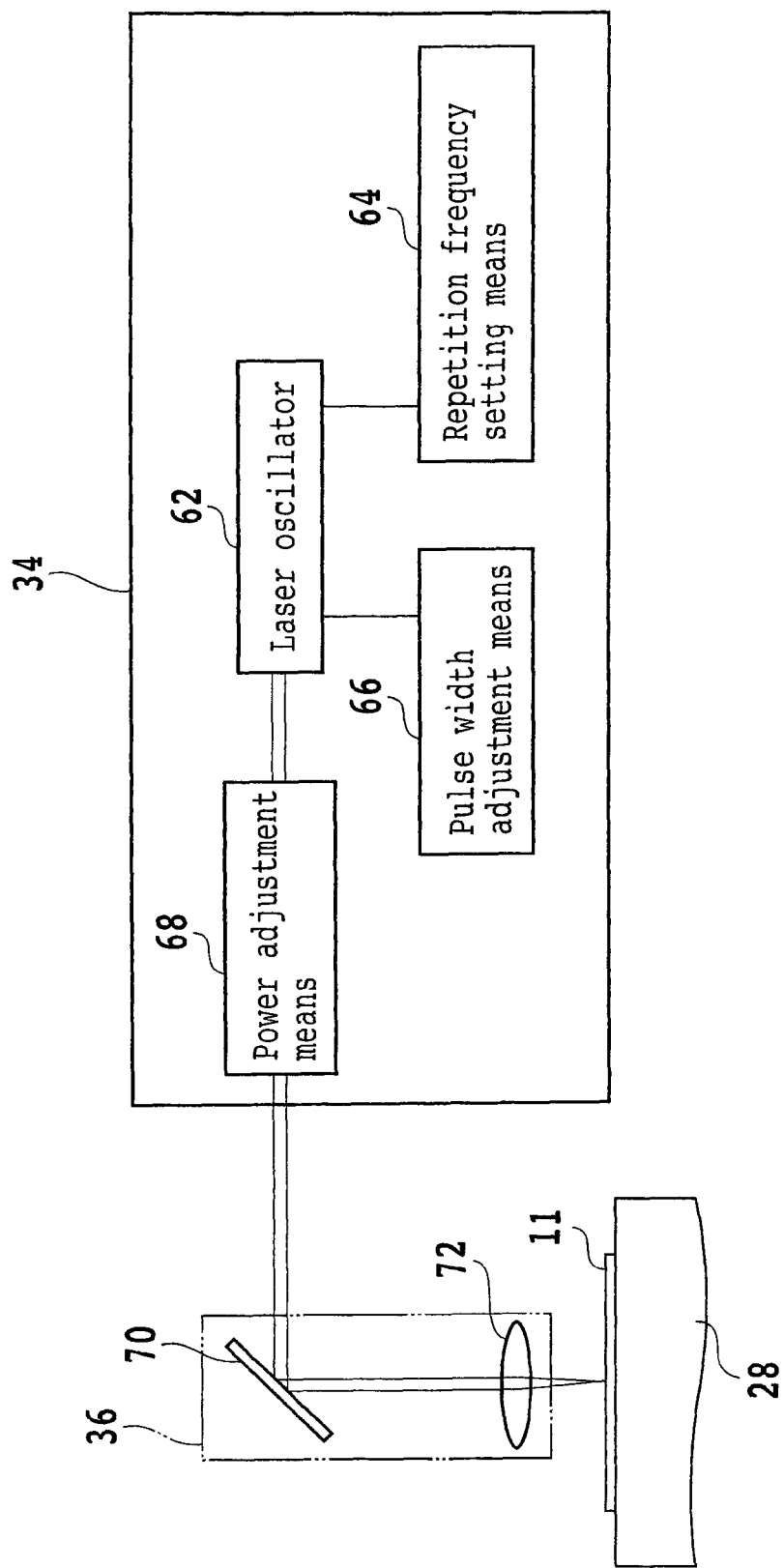
FIG. 2 is a block diagram of a light beam irradiation unit.

A column 32 is provided uprightly on the stationary base 4 and has a casing 35 attached thereto for accommodating a laser beam irradiation unit 34. As seen in FIG. 2, the laser beam irradiation unit 34 includes a laser oscillator 62 for oscillating a YAG laser or a YVO4 laser, a repetition frequency setting means 64, a pulse width adjustment means 66, and a power adjustment means 68. A pulse laser beam adjusted to a predetermined power by the power adjustment means 68 of the laser beam irradiation unit 34 is reflected by a mirror 70 of a condenser 36 attached to en end of the casing 35 and then condensed by a condensing object lens 72, whereafter it is irradiated upon an optical device wafer 11 held on the chuck table 28.

Referring back to FIG. 1, at an end portion of the casing 35, an image pickup means 38 for detecting a working region to be subjected to laser processing is disposed in alignment with the condenser 36 in the X-axis direction. The image pickup means 38 includes an image pickup element such as an ordinary CCD for picking up an image of the working region of the optical device wafer 11 using visible light. The image pickup means 38 further includes an infrared ray irradiation means for irradiating infrared rays upon the optical device wafer 11, an optical system for capturing the infrared rays irradiated by the infrared ray irradiation means, and an infrared ray image pickup means configured from an infrared ray image pickup element such as an infrared ray CCD for outputting an electric signal corresponding to the infrared rays captured by the optical system. An image signal of the picked up image is transmitted to a controller (control means) 40.

The controller 40 is configured from a computer and includes a central processing unit (CPU) 42 for carrying out arithmetic processing in accordance with a control program, a read only memory (ROM) 44 for storing the control program and so forth, a readable and writable random access memory (RAM) 46 for storing a result of the arithmetic processing result and so forth, a counter 48, an input interface 50, and an output interface 52.

A work feeding amount detection means 56 is configured from a linear scale 54 disposed along the guide rails 14 and a reading head (not shown) disposed on the first slide block 6. A detection signal of the work feeding amount detection means 56 is inputted to the input interface 50 of the controller 40. An indexing feeding amount detection means 60 is configured from a linear scale 58 disposed along the guide rails 24 and a reading head (not shown) disposed on the second slide block 16. A detection signal of the indexing feeding amount detection means 60 is inputted to the input interface 50 of the controller 40.

An image signal picked up by the image pickup means 38 is also inputted to the input interface 50 of the controller 40. Meanwhile, a control signal is outputted from the output interface 52 of the controller 40 to the stepping motor 10, stepping motor 20, laser beam irradiation unit 34 and so forth.

Figure 3:
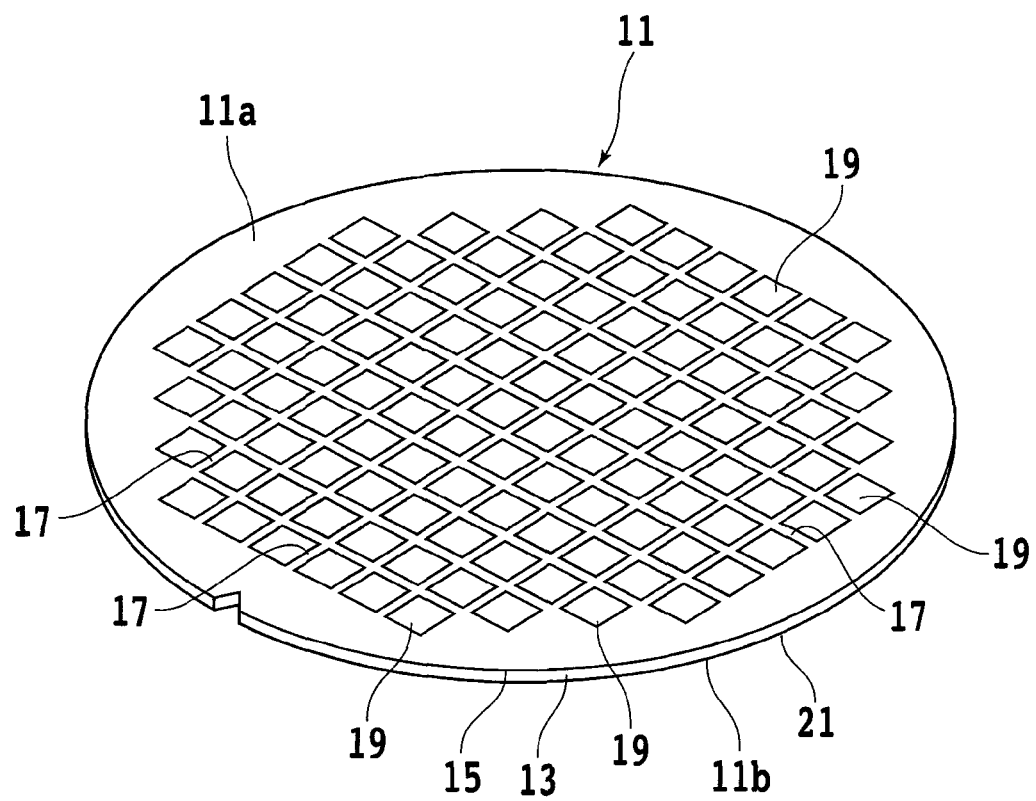
FIG. 3 is a perspective view of the front surface side of an optical device wafer.
Figure 4:
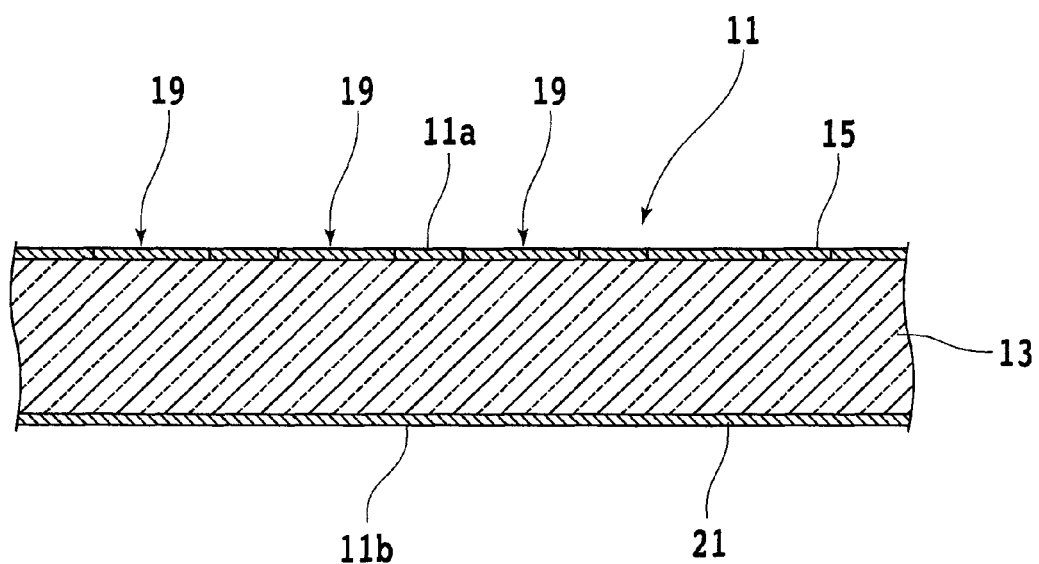
FIG. 4 is a sectional view of an optical device wafer having a reflective film formed on the reverse surface thereof.

Referring to FIG. 3, there is shown a perspective view of the front surface side of the optical device wafer 11 which is a working object of the splitting method of the present invention. The optical device wafer 11 is configured from a sapphire substrate 13 on which an epitaxial layer (light emitting layer) 15 of gallium nitride (GaN) or the like is stacked. The optical device wafer 11 has a reflective film 21 (refer to FIG. 4) formed on the reverse surface thereof. The optical device wafer 11 has a front surface 11a on which the epitaxial layer 15 is stacked and a reverse surface 11b on which the reflective film 21 is formed.

The reflective film 21 is configured, for example, from a metal film, a DBR (Distributed Bragg Reflector) or the like. The DBR is configured from a dielectric multilayer film formed from a plurality of stacked dielectrics of different refractive indices. The sapphire substrate 13 has a thickness of, for example, 100 μm, and the epitaxial layer 15 has a thickness of, for example, 5 μm. A plurality of optical devices 19 such as LEDs are formed on the epitaxial layer 15 such that they are partitioned by scheduled splitting lines (streets) 17 formed in a lattice shape.

Now, a splitting method for an optical device wafer according to a first embodiment of the present invention is described in detail with reference to FIGS. 5 to 8. In order to carry out the splitting method, preferably the optical device wafer 11 is adhered to a dicing tape T which is an adhesive tape with an outer peripheral portion thereof adhered to an annular frame F, and the optical device wafer 11 is supported by the annular frame F through the dicing tape T as shown in FIG. 5.

The optical device wafer 11 is sucked to and held by the chuck table 28 of the laser processing apparatus 2 with the dicing tape T interposed therebetween, and the reflective film 21 formed on the reverse surface of the optical device wafer 11 is exposed. Then, an image of the optical device wafer 11 is picked up through the reflective film 21 from the reverse surface 11b side by means of the infrared ray image pickup element of the image pickup means 38 to carry out alignment for aligning a region of the optical device wafer 11 corresponding to the scheduled splitting lines 17 with the condenser 36 in the X-axis direction. For this alignment, a well-known image process such as pattern matching is utilized. After the alignment of the scheduled splitting lines 17 extending in a first direction is carried out, the chuck table 28 is rotated by 90 degrees, and the alignment of the scheduled splitting lines 17 extending in a second direction perpendicular to the first direction is carried out.

Figure 5:
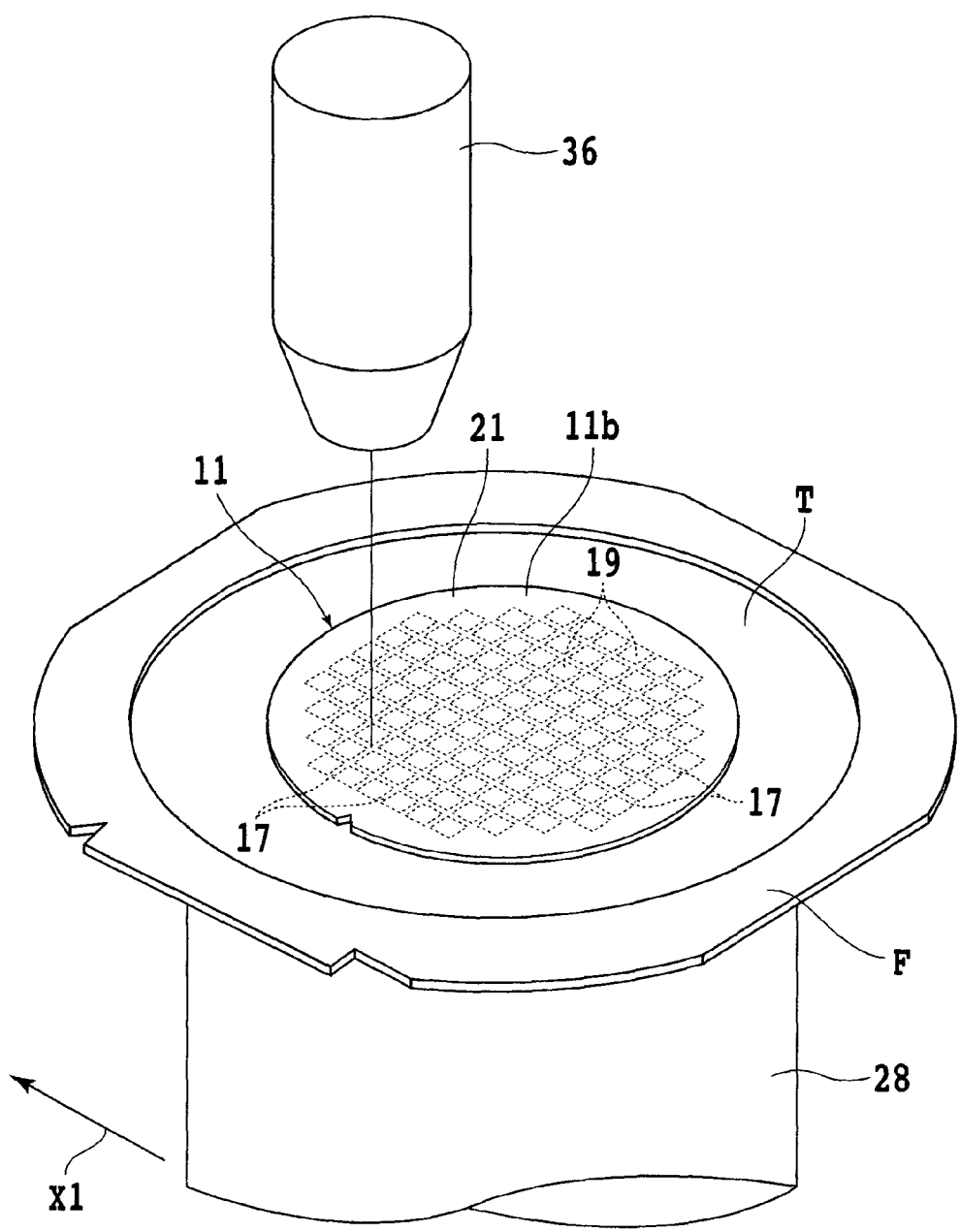
FIG. 5 is a perspective view illustrating a laser beam irradiation step according to a first embodiment.
Figure 6:
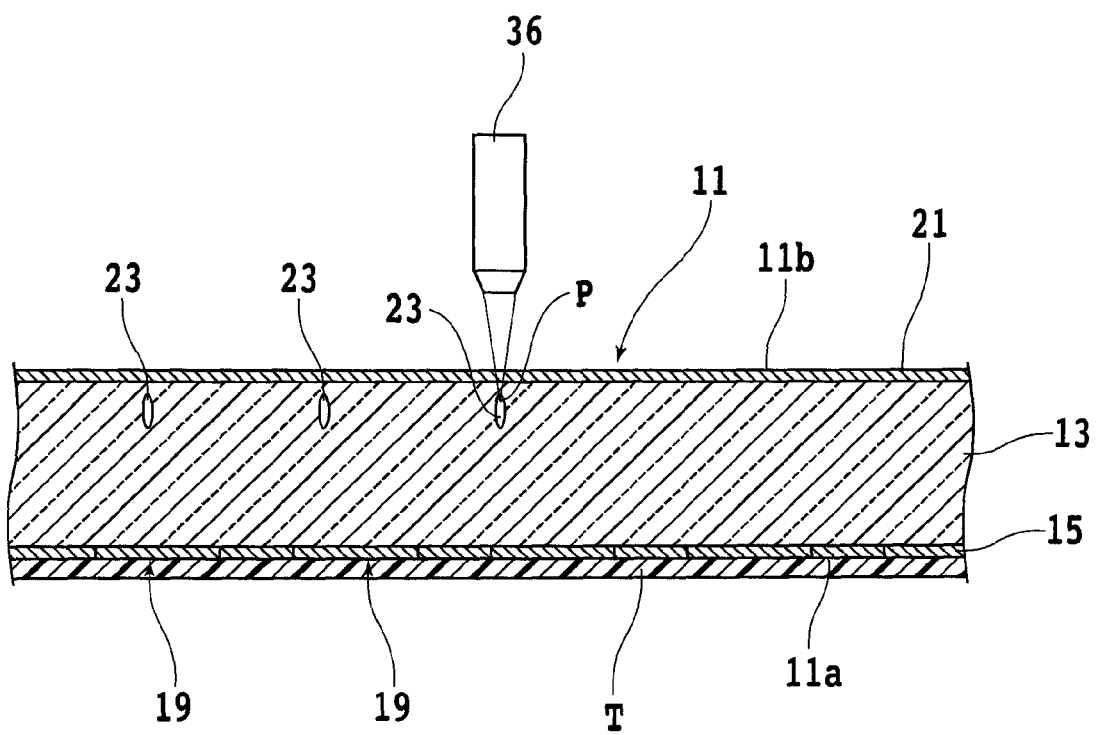
FIG. 6 is a sectional view illustrating the laser beam irradiation step.

After the alignment is carried out, as seen in FIGS. 5 and 6, a focal point P (refer to FIG. 6) of a laser beam is positioned to the inside of the optical device wafer 11 and a laser beam irradiation step of irradiating the laser beam along the scheduled splitting lines 17 from the reverse surface 11b side of the optical device wafer 11 through the reflective film 21 to form a modification layer 23, which serves as a splitting starting point, in the inside of the optical device wafer 11 is carried out. At this laser beam irradiation step, a laser beam having a wavelength with which the transmittance through the reflective film 21 is equal to or higher than 80% is irradiated from the reverse surface 11b side of the optical device wafer 11. Preferably, the wavelength of the laser beam is within a range of 680 nm to 1 mm.

Particularly, at this laser beam irradiation step, the focal point P of the laser beam whose transmittance through the reflective film 21 is equal to or higher than 80% is positioned to the inside of the optical device wafer 11 and such laser beam is irradiated along the scheduled splitting lines 17 extending in the first direction from the reverse surface 11b side of the optical device wafer 11 while the chuck table 28 is fed for working in the direction indicated by an arrow mark X1 in FIG. 5 to form, in the inside of the optical device wafer 11, the modification layer 23 which extends in the first direction. While the chuck table 28 is fed for indexing in the Y-axis direction, such modification layers 23 are formed in the inside of the optical device wafer 11 corresponding to all of the scheduled splitting lines 17 extending in the first direction. Then, the chuck table 28 is rotated by 90 degrees, and thereafter, similar modification layers 23 are formed in the inside of the optical device wafer 11 corresponding to all of the scheduled splitting lines 17 extending in the second direction perpendicular to the first direction.

Figure 7:
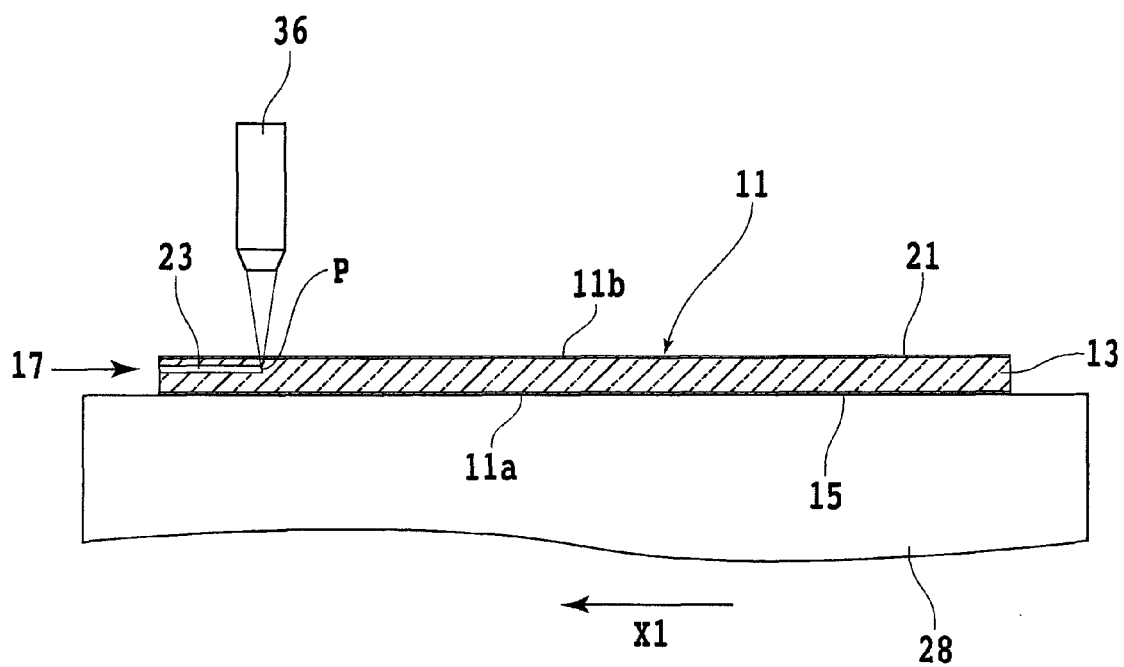
FIG. 7 is a sectional view illustrating a laser beam irradiation step according to a modification example of the first embodiment.

The modification layer 23 is a region which is different in density, refractive index, mechanical strength or other physical properties from the surroundings. The modification layer 23 includes, for example, a melted and re-hardened region, a crack region, a dielectric breakdown region and a refractive index changing region and also includes a region which includes such regions in a mixed state. Where the optical devices 19 are configured from blue LEDs, the processing conditions at the laser beam irradiation step are set, for example, in the following manner:

Light source: LD pumoed Q switch, Nd:YVO4 pulse laser
Wavelength: 1,064 nm
Repetition frequency: 100 kHz
Pulse output power: 10 μJ
Condensed light spot diameter: φ 1 μm
Work feeding speed: 100 mm/second At the laser beam irradiation step in the embodiment described above, the optical device wafer 11 is adhered to the dicing tape T adhered at an outer peripheral portion thereof to the annular frame F, and the optical device wafer 11 is sucked to and held by the chuck table 28 with the dicing tape T interposed therebetween. However, the front surface 11a side of the optical device wafer 11 on which the epitaxial layer 15 is formed may be directly sucked to and held by the chuck table 28 as seen in FIG. 7 to carry out the laser beam irradiation step. In the case of this modification example, before the splitting step is carried out, the optical device wafer 11 having the modification layers 23 formed in the internal region of the optical device wafer 11 corresponding to all of the scheduled splitting lines 17 is adhered to the dicing tape T adhered at an outer peripheral portion thereof to the annular frame F as shown in FIG. 5 such that the optical device wafer 11 is supported by the annular frame F through the dicing tape T.

Figure 8:
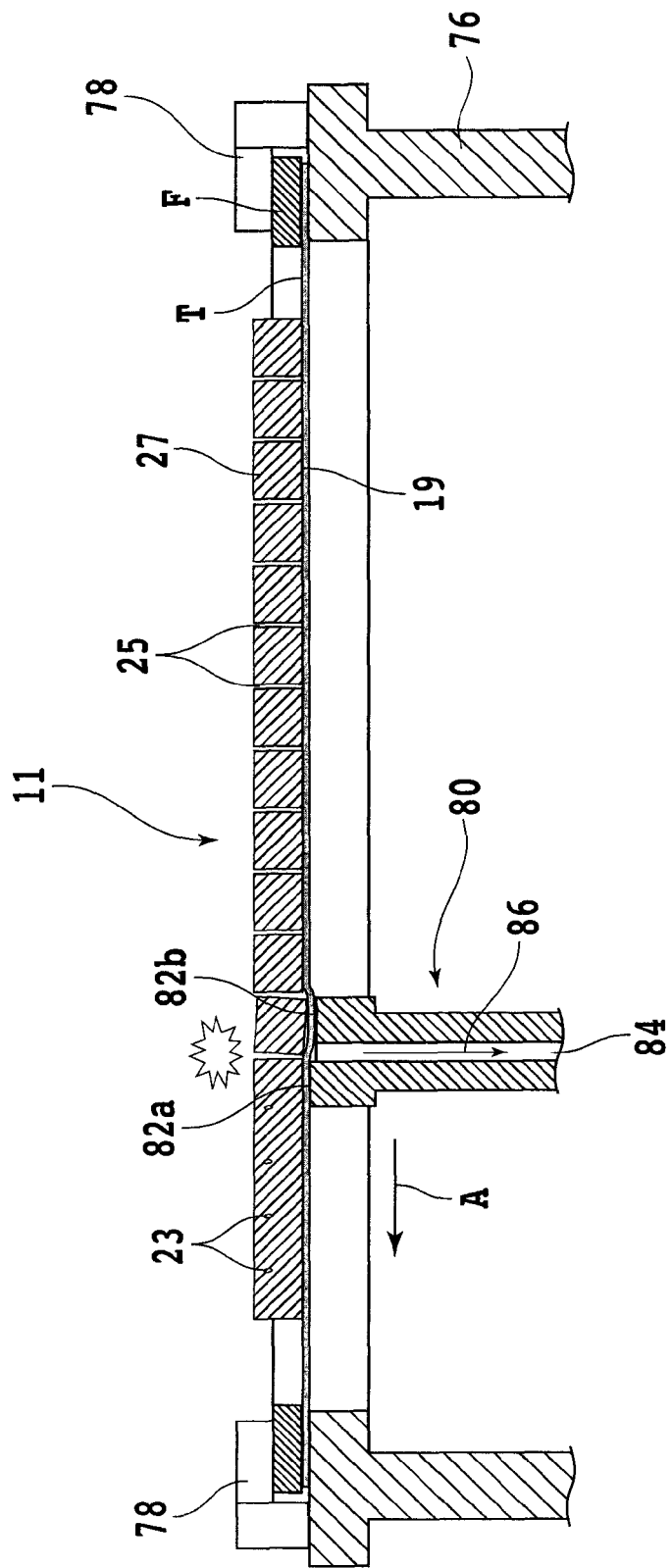
FIG. 8 is a sectional view illustrating a splitting step according to the first embodiment.

In the splitting method for the optical device wafer 11 according to the present invention, the laser beam irradiation step is carried out to form the modification layers 23, each of which serves as the splitting starting point, in the inside of the optical device wafer 11, and then the splitting step of applying external force to the optical device wafer 11 in which the modification layers 23 are formed to split the optical device wafer 11 along the scheduled splitting lines 17 is carried out. In the first embodiment of the splitting step, the annular frame F is placed on a receiving face of a tube 76 and is clamped by a clamp 78, for example, as seen in FIG. 8. Then, a bar-shaped splitting jig 80 is disposed in the tube 76. The splitting jig 80 has an upper stage holding face 82a and a lower stage holding face 82b, and has a vacuum suction path 84 formed such that the path 84 is open to the lower stage holding face 82b. A detailed structure of the splitting jig 80 is disclosed in Japanese Patent Laid-Open No. 4361506.

In order to carry out the splitting step by the splitting jig 80, while the vacuum suction path 84 of the splitting jig 80 is sucked by vacuum as indicated by an arrow mark 86, the upper stage holding face 82a and the lower stage holding face 82b of the splitting jig 80 are placed into contact with the dicing tape T from the lower side, and then the splitting jig 80 is moved in the direction indicated by an arrow mark A. That is, the splitting jig 80 is moved in the direction perpendicular to the scheduled splitting line 17 along which splitting is to be carried out. Consequently, when the modification layer 23 which serves as the splitting starting point is moved to a position just above an inner side edge of the upper stage holding face 82a of the splitting jig 80, then bending stress is generated in a concentrated manner at a portion of the scheduled splitting line 17 having the modification layer 23. Therefore, the optical device wafer 11 is split along the scheduled splitting line 17 by the bending stress.

After the splitting along all of the scheduled splitting lines 17 extending in the first direction comes to an end, the splitting jig 80 is rotated by 90 degrees or the tube 76 is rotated by 90 degrees, and the optical device wafer 11 is split similarly along the scheduled splitting lines 17 extending in the second direction perpendicular to the scheduled splitting lines 17 extending in the first direction. Consequently, the optical device wafer 11 is split into individual optical device chips 27.

Figure 9:
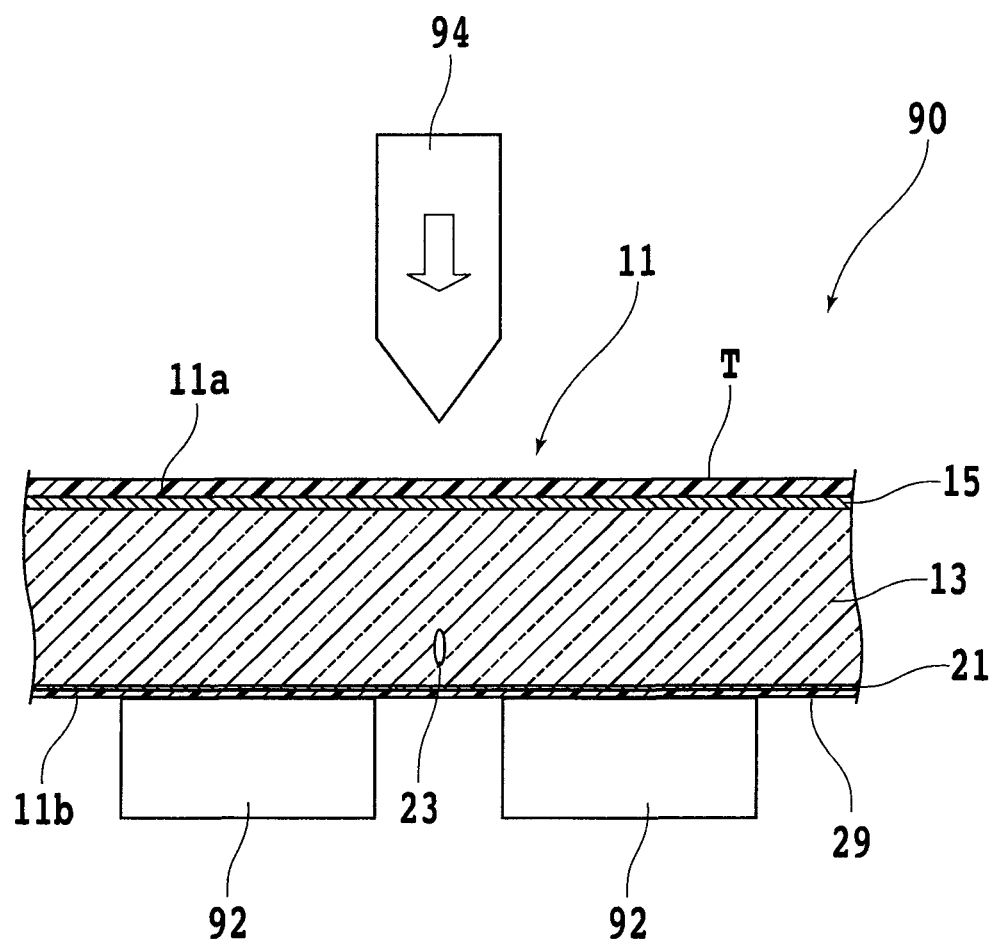
FIG. 9 is a sectional view illustrating a splitting step according to a second embodiment.

Now, a splitting step according to a second embodiment is described with reference to FIG. 9. At the splitting step of the present embodiment, a contact preventing film 29 is adhered to the reverse surface 11b of the optical device wafer 11. Then, while the optical device wafer 11 is supported by a pair of support bases 92 of a splitting jig 90 such that the modification layer 23 is positioned at the center between the support bases 92, a wedge member 94 is pressed against the optical device wafer 11 from the front surface 11a side. Consequently, bending stress is generated in a concentrated manner at the portion of the scheduled splitting line 17 having the modification layer 23, and the optical device wafer 11 is split along the scheduled splitting line 17 by the bending stress.

The splitting jig 90 is successively shifted by a pitch of the scheduled splitting lines 17 so that the optical device wafer 11 is split along all of the scheduled splitting lines 17 extending in the first direction. Then, the optical device wafer 11 is rotated by 90 degrees and split similarly along the scheduled splitting lines 17 extending in the second direction. Consequently, the optical device wafer 11 is split into the individual optical device chips 27.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A splitting method for an optical device wafer, the optical device wafer having optical devices formed individually in regions partitioned by a plurality of crossing scheduled splitting lines provided on a front surface and having a reflective film formed on a reverse surface, comprising:
    a laser beam irradiation step of positioning a focal point of a laser beam to the inside of the optical device wafer and irradiating the laser beam along the scheduled splitting lines from a reverse surface side of the optical device wafer to form modification layers in an inside of the optical device wafer; and
    a splitting step of applying, after the laser beam irradiation step is carried out, external force to the optical device wafer and splitting the optical device wafer along the plurality of crossing scheduled splitting lines to form a plurality of optical device chips;
    wherein a wavelength of the laser beam irradiated upon the optical device wafer in the laser beam irradiation step has a transmittance through the reflective film greater than or equal to 80%.

2. The splitting method for the optical device wafer according to claim 1, wherein the wavelength of the laser beam irradiated upon the optical device wafer in the laser beam irradiation step ranges from 680 nm to 1 mm.

3. The splitting method for the optical device wafer according to claim 1, wherein the reflective film is configured from a multilayer film formed from stacked materials having different refractive indices.

* * * * *